United States Patent
Taniguchi et al.

(10) Patent No.: US 9,502,109 B2
(45) Date of Patent: Nov. 22, 2016

(54) NON-VOLATILE SEMICONDUCTOR STORAGE DEVICE

(71) Applicant: Floadia Corporation, Kondaira-shi, Tokyo (JP)

(72) Inventors: Yasuhiro Taniguchi, Kodaira (JP); Hideo Kasai, Kodaira (JP); Yutaka Shinagawa, Kodaira (JP); Kosuke Okuyama, Kodaira (JP)

(73) Assignee: FLOADIA CORPORATION, Kodaira-Shi (JP)

( * ) Notice: Subject to any disclaimer, the term of this patent is extended or adjusted under 35 U.S.C. 154(b) by 0 days.

(21) Appl. No.: 14/432,797

(22) PCT Filed: Sep. 27, 2013

(86) PCT No.: PCT/JP2013/076284
§ 371 (c)(1),
(2) Date: Apr. 1, 2015

(87) PCT Pub. No.: WO2014/061425
PCT Pub. Date: Apr. 24, 2014

(65) Prior Publication Data
US 2015/0262666 A1    Sep. 17, 2015

(30) Foreign Application Priority Data
Oct. 19, 2012 (JP) .................... 2012-231439

(51) Int. Cl.
*G11C 14/00* (2006.01)
*H01L 29/788* (2006.01)
(Continued)

(52) U.S. Cl.
CPC .......... *G11C 14/0063* (2013.01); *G11C 7/18* (2013.01); *G11C 8/16* (2013.01); *G11C 16/04* (2013.01);
(Continued)

(58) Field of Classification Search
CPC .......... G11C 14/0063; G11C 16/0441; G11C 16/04; G11C 16/08; G11C 16/12; G11C 16/14; G11C 16/26; H01L 29/7881; H01L 27/11519; H01L 27/11558
USPC ............ 365/185.08, 185.17, 185.05, 185.07, 365/185.1
See application file for complete search history.

(56) References Cited

U.S. PATENT DOCUMENTS

| | | | | |
|---|---|---|---|---|
| 4,387,444 A | * | 6/1983 | Edwards | G11C 16/0441 365/185.07 |
| 4,388,704 A | * | 6/1983 | Bertin | G11C 14/00 257/E27.103 |

(Continued)

FOREIGN PATENT DOCUMENTS

| | | |
|---|---|---|
| JP | H05-80115 A | 4/1993 |
| JP | 2001-358239 A | 12/2001 |

(Continued)

OTHER PUBLICATIONS

International Search Report of Corresponding Application No. PCT/JP2013/076284; Dated Oct. 29, 2013.

(Continued)

*Primary Examiner* — Alexander Sofocleous
*Assistant Examiner* — Sung Cho
(74) *Attorney, Agent, or Firm* — Pearne & Gordon LLP (57) ABSTRACT

Provided is a non-volatile semiconductor memory device capable of reliably preventing a malfunction of a read transistor without increasing the number of bit lines. In a non-volatile semi conductor memory device (1), program transistors (5a, 5b) and erase transistors (3a, 3b) serving as charge transfer paths during data programming and erasure are provided while a second bit line (BLN1) connected to the program transistor (5a) in a first cell (2a) for performing data programming also serves as a reading bit line in the other second cell (2b) by switching switch transistors (SWa, SWb) so that malfunctions of read transistors (4a, 4b) that occur because the read transistors are used for data programming and erasure can be reliably prevented without the number of bit lines being increased.

5 Claims, 8 Drawing Sheets

(51) Int. Cl.
*H01L 27/115* (2006.01)
*G11C 16/04* (2006.01)
*G11C 16/08* (2006.01)
*G11C 16/12* (2006.01)
*G11C 16/14* (2006.01)
*G11C 16/26* (2006.01)
*G11C 7/18* (2006.01)
*G11C 8/16* (2006.01)
*G11C 16/24* (2006.01)

(52) U.S. Cl.
CPC ........... *G11C 16/0441* (2013.01); *G11C 16/08* (2013.01); *G11C 16/12* (2013.01); *G11C 16/14* (2013.01); *G11C 16/26* (2013.01); *H01L 27/11519* (2013.01); *H01L 27/11558* (2013.01); *H01L 29/7881* (2013.01); *G11C 16/24* (2013.01)

(56) References Cited

U.S. PATENT DOCUMENTS

| | | | | |
|---|---|---|---|---|
| 4,399,552 | A * | 8/1983 | Renshaw | G03B 42/025 378/167 |
| 4,803,662 | A | 2/1989 | Tanaka | |
| 5,523,971 | A * | 6/1996 | Rao | G11C 16/0441 365/154 |
| 5,745,432 | A * | 4/1998 | McClure | G11C 7/1078 365/201 |
| 6,414,873 | B1 * | 7/2002 | Herdt | G11C 14/00 365/154 |
| 7,239,558 | B1 * | 7/2007 | Poplevine | G11C 11/005 365/154 |
| 7,391,647 | B2 * | 6/2008 | Fang | G11C 16/0408 257/E21.694 |
| 7,483,310 | B1 * | 1/2009 | Bu | G11C 16/0416 257/314 |
| 7,656,698 | B1 | 2/2010 | Poplevine et al. | |
| 8,009,483 | B2 * | 8/2011 | Kamiya | G11C 16/0441 365/185.18 |
| 8,094,498 | B2 * | 1/2012 | Yamamoto | G11C 16/0441 365/149 |
| 2005/0207223 | A1 * | 9/2005 | Taheri | G11C 7/20 365/185.08 |
| 2007/0070707 | A1 | 3/2007 | Yamamoto et al. | |
| 2008/0151616 | A1 * | 6/2008 | Ashokkumar | G11C 14/0063 365/184 |
| 2008/0165583 | A1 * | 7/2008 | Schatzberger | G11C 14/00 365/185.07 |
| 2011/0044109 | A1 * | 2/2011 | Shih | G11C 14/0063 365/185.08 |
| 2011/0103146 | A1 | 5/2011 | Tailliet | |
| 2013/0294161 | A1 * | 11/2013 | Lee | G11C 16/0433 365/185.08 |
| 2015/0049535 | A1 * | 2/2015 | Yamauchi | G11C 11/405 365/51 |

FOREIGN PATENT DOCUMENTS

| | | | |
|---|---|---|---|
| JP | 2005-175411 | A | 6/2005 |
| JP | 2006-527897 | A | 12/2006 |
| JP | 2007-042172 | A | 2/2007 |
| JP | 2007042172 | A * | 2/2007 |
| JP | 2007-081880 | A | 3/2007 |
| JP | 2007-213699 | A | 8/2007 |
| JP | 2008-004718 | A | 1/2008 |
| JP | 2011-23567 | A | 2/2011 |
| JP | 2011023567 | A * | 2/2011 |
| JP | 2011-123958 | A | 6/2011 |
| WO | 2007/120721 | A2 | 10/2007 |
| WO | 2009/119658 | A1 | 10/2009 |

OTHER PUBLICATIONS

Office Action from Corresponding Japanese Application No. 2012-231439; Dated Mar. 19, 2013.
Written Opinion from Corresponding Singapore Application No. 11201502737U; Dated Dec. 23, 2015.
Extended European Search Report from Corresponding Application No. EP 138477561; Dated Apr. 22, 2016.

* cited by examiner

| | EG | RG | SL | PG | Vpp | WL |
|---|---|---|---|---|---|---|
| PROGRAMMING (FROM SRAM TO NON-VOLATILE MEMORY UNIT) | 6 | 0 | 6 | 12 | 6 | 0 |
| ERASURE (DATA ERASURE IN NON-VOLATILE MEMORY UNIT) | 12 | 0 | 0 | 0 | Vcc | 0 |
| DATA LOADING (FROM NON-VOLATILE MEMORY UNIT TO SRAM) | 0 | Vcc | 0 | 0 | Vcc | 0 |
| WRITING (WRITING INTO SRAM) | Don't care | 0 | Don't care | Don't care | Vcc | Vcc/0 |
| READING (READING FROM SRAM) | Don't care | 0 | Don't care | Don't care | Vcc | Vcc/0 |

NON-VOLATILE SEMICONDUCTOR STORAGE DEVICE

TECHNICAL FIELD

The present invention relates to a non-volatile semiconductor memory device, and is appropriately applied to a non-volatile semiconductor memory device manufactured using a single-layer polycrystalline silicon (polysilicon), for example.

BACKGROUND ART

Generally, a non-volatile semiconductor memory device using a single-layer polysilicon may include a large-area capacitor using a well as a control gate, a MOS (Metal-Oxide-Semiconductor) transistor for data reading (hereinafter merely referred to as a read transistor) as constituent elements. Conventionally, the non-volatile semiconductor memory device has had another capacitor added thereto to further add an erasure function thereto.

National Publication of International Patent Application. No. 2009-538519 (hereinafter referred to as Patent Literature 1) is an example of the non-volatile semiconductor memory device, in which a PMOS (P-channel MOS) access transistor is provided as a read transistor, and a current flowing through the read transistor is detected during a data reading operation so that it can be determined whether data is programmed to or erased from a corresponding floating gate. In Patent Literature 1, during data erasure operation, a high voltage drop is generated between both ends of a gate insulating film of the read transistor, and charge is elected from the floating gate via the gate insulating film of the read transistor so that data can be erased from a memory cell.

Furthermore, Patent Literature 1 also discloses a configuration in which an NMOS (N-channel MOS) access transistor is provided as a read transistor, charge is tunneled, into the floating gate from a channel of the read transistor when data is programmed to the floating gate, and the data is programmed to the floating gate as another example.

However, generally in an area of the gate insulating film through which the charge has passed, a charge passage region is damaged by an applied electric field to or hot-carrier stress on the gate insulating film. Therefore, in a conventional read transistor in which charge passes through a gate insulating film during data programming and erasure operations, the gate insulating film is damaged. A reading current obtained from the read transistor decreases due to interface state generation, for example, so that a malfunction of the read transistor may occur.

When the read transistor is used for data programming, like in Patent Literature 1, a part of the charge may be injected into a sidewall region of the read transistor, for example. The charge in the sidewall region is difficult to remove. In the read transistor, a threshold voltage (a voltage at the time when the read transistor is switched from off to on, which is referred to as Vth) is shifted by repetition of data programming so that a malfunction of the read transistor may occur.

As a configuration for solving such a problem, a configuration in which a read transistor is not used as a charge transfer path during data programming and erasure is considered. In this case, a configuration in which a programming bit line and a reading bit line for determining selection/non-selection of programming are independently provided, and the bit lines prevent a read transistor region from serving as a charge transfer path during data programming and erasure can be implemented, like in a non-volatile semiconductor memory device discussed in Japanese Patent Laid-Open No. 2005-175411 (hereinafter referred to as Patent Literature 2).

CITATION LIST

Patent Literature

Patent Literature 1: National Publication of International Patent Application No. 2009-538519 Patent Literature 2: Japanese Patent Laid-Open. No, 2005-175411

SUMMARY OF INVENTION

Technical Problem

However, in a non-volatile semiconductor memory device thus configured, a reading bit line is independently required in addition to or separately from a programming bit line for determining selection/non-selection of programming. Thus, the number of bit lines to be controlled doubles, complicating a control circuit around a memory mat and also leading to an increase in the area of the control circuit in addition to leading to an increase in a cell region.

Therefore, the present invention has been made in consideration of the foregoing points, and is directed to providing a non-volatile semiconductor memory device capable of reliably preventing a malfunction of a read transistor without increasing the number of bit lines.

Solution to Problem

To solve such an issue, the present invention as set forth in claim 1 is directed to a non-volatile semiconductor memory device including a plurality of floating gates which are electrically insulated and a first bit line and a second bit line, a cell being configured for each of the floating gates, in which each of cells includes a read transistor for reading out a voltage depending on the presence or absence of charge in the floating gate, a program transistor that injects charge into the floating gate, an erase transistor that ejects charge from the floating gate, and a control capacitor that adjusts a potential at the floating gate, the floating gate extending on respective active regions of the read transistor, the program transistor, the erase transistor, and the control capacitor, one cell of the cells has a configuration in which the first bit line is connected to the read transistor via a switch transistor, and the second bit line is directly connected to the program transistor, and the other cell paired with the one cell, has a configuration in which the second bit line is connected to the read transistor via a switch transistor, and the first bit line is directly connected to the program transistor.

To solve such an issue, the present invention is directed to a non-volatile semiconductor memory device including a plurality of floating gates electrically insulated, and a first bit line and a second bit line, a cell being configured for each of the floating gates, in which each of cells includes a read transistor for reading out a voltage depending on the presence or absence of charge in the floating gate, a program transistor that injects charge into the floating gate, an erase transistor that elects charge from the floating gate, and a control capacitor that adjusts a potential at the floating gate, the floating gate extending on respective active regions of the read transistor, the program transistor, the erase transistor, and the control capacitor, one cell of the cells
includes one switch transistor that has its one end connected to the first bit line to which a programming voltage for injecting charge to the floating gate by the program transistor or a programming inhibition voltage for injecting no charge into the floating gate by the program transistor is applied during a data programming operation and the other end connected to one end of the read transistor, is turned off during the data programming operation, and shuts off the supply of the programming voltage and the programming inhibition voltage from the first bit line to the read transistor, and has a configuration in which the second bit line is directly connected to the program transistor, the other cell, paired with the one cell
includes the other switch transistor that has its one end connected to the second bit line, to which the programming voltage or the programming inhibition voltage is applied during the data programming operation and which is connected to the one cell, and the other end connected to the one end of the read transistor, is turned off during the data programming operation, and shuts off the supply of the programming voltage and the programming inhibition voltage from the second bit dine to the read transistor, and has a configuration in which the first bit line is directly connected to the program transistor, and during a data reading operation, a reading voltage is applied to the first bit line and the second bit line to which the programming voltage or the programming inhibition voltage is applied during the data programming operation, and the switch transistor in a cell that reads out a voltage depending on the presence or absence of the charge at the floating gate is turned on, to electrically connect the first bit line or the second bit line connected to the switch transistor with the read transistor to each other.

In the non-volatile semiconductor memory device as set forth in claim 1, in each of the cells, the erase transistor is formed in an N-type well or a P-type well, and she control capacitor is formed in an N-type well or a P-type well having the same conductivity type as that of the erase transistor and different from the N-type well or the P-type well of the erase transistor, and the read transistor, the switch transistor, and the program transistor are formed in a P-type well or an N-type well having a different conductivity type from those of the erase transistor and the control capacitor.

Furthermore, in each of the cells, the erase transistor is formed in an N-type well, the control capacitor is formed in an N-type well different from the N-type well in which the erase transistor is formed, and the read transistor, the switch transistor, and the program transistor are formed in a P-type well.

Advantageous Effects of Invention

According to the present invention, the non-volatile semiconductor memory device includes a second bit line connected to the program transistor in one of cells for performing data programming and also serving as a reading bit line in the other cell by switching of switch transistors and program transistors and erase transistors serving as charge transfer paths during data programming and erasure so that malfunctions of read transistors that occur because the read transistor is used for data programming and erasure can be reliably prevented without the number of bit lines being increased.

DESCRIPTION OF EMBODIMENTS

An embodiment of the present invention will be described in detail below with reference to the drawings.

(1) Circuit Configuration of Non-Volatile Semiconductor Memory Device

Figure 1:
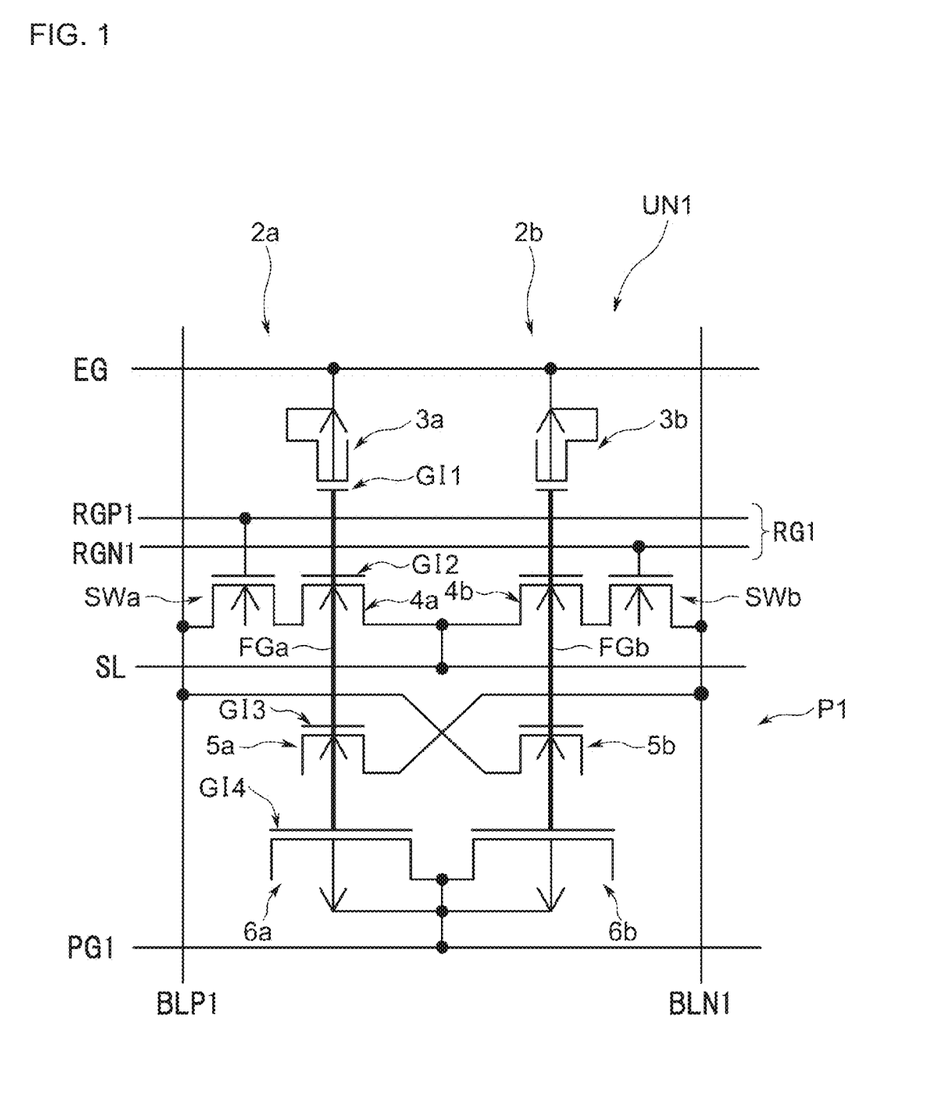
FIG. 1 is a circuit diagram illustrating a circuit configuration of a memory unit.

In FIG. 1, UN1 denotes a memory unit constituting a non-volatile semiconductor memory device according to the present invention. While a plurality of memory units are arranged in a matrix, as described below in FIG. 3, in the non-volatile semiconductor memory device, the one memory unit UN1 is first paid attention to, to describe this configuration below. As illustrated in FIG. 1, the memory unit UN1 includes a first cell 2a and a second cell 2b, a first bit line BLP1 and a second bit line BLN1 are connected to the first cell 2a and to the second cell 2b as well.

An erase gate line EG, a source line SL, a read gate line RG1, and a control gate line PG1 are connected to the first cell 2a and the second cell 2b, and a predetermined voltage can be applied, as needed, from each of the erase gate line EG, the source line SL, the read gate line PG1, and the control gate line PG1.

In the memory unit UN1, when only the one first cell 2a is paid attention to, the first bit line BLP1 and the second bit line BLN1 are connected to the first cell 2a, and the number of bit lines is two per cell. However, in this memory unit UN1, the second bit line BLN1 used for programming in the one first cell 2a, for example, also serves as a bit line for reading in the other second cell 2b. Thus, the number of bit lines and the number of cells are the same as a whole, and de effective number of bit lines becomes one per cell.

In the present embodiment, the first cell 2a and the second cell 2b have the same configuration, and constitute a complementary cell storing one bit by using two cells, for example. While a case where the first cell 2a and the second cell 2b constitute a complementary cell storing one bit by using the two cells will be described in the present embodiment, the present invention is not limited to this. A memory unit storing one bit for each cell (i.e., a memory unit storing respective one bits in the first cell 2a and the second cell 2b and storing a total of two bits) may be used.

When the configuration of the first cell 2a is paid attention to, the first cell 2a includes an erase MOS transistor (hereinafter referred to as an erase transistor) 3a, a read (reading) MOS transistor (hereinafter referred to as a read transistor) 4a, a program (programming) MOS transistor (hereinafter referred to as a program transistor) 5a, a control capacitor 6a, and a switch MOS transistor (hereinafter referred to as a switch transistor) SWa, and the erase transistor 3a, the read transistor 4a, the program transistor 5a, and the control capacitor 6a share one floating gate FGa.

The floating gate FGa extends on respective active regions of the erase transistor 3a, the read transistor 4a, the program transistor 5a, and the control capacitor 6a, and can function as a control gate of the erase transistor 3a, the read transistor 4a, and the program transistor 5a and function as an electrode of the control capacitor 6a. In this case, she floating gate FGa is connected to a gate insulating film GI1 of the erase transistor 3a, a gate insulating film GI2 of the read transistor 4a, a gate insulating film GI3 of the program transistor 5a, and an insulating film GI4 of the control capacitor 6a.

The control capacitor 6a has at its one end a diffusion layer connected to the control gate line PG1, and can transmit a potential on the control gate line PG1 to the floating gate FGa. The erase transistor 3a is a P-type MOS, has at its one end a diffusion layer connected to the erase gate line EG, and can transmit a potential on the erase gate line EG to the floating gate FGa via the gate insulating film GI1. A diffusion layer at the other end of the erase transistor 3a is short-circuited to a first N-type well N1, described below.

The read transistor 4a is an N-type MOS, and has at its one end a diffusion layer connected to the source line SL and has at its other end a diffusion layer connected to a diffusion layer at one end of the switch transistor SWa. The switch transistor SWa is an N-type MOS, and has at its other end a diffusion layer connected to the first bit line BLP1, and can electrically connect or disconnect the first bit line BLP1 and the read transistor 4a to or from each other by being turned on or off, as needed.

In the present embodiment, the read gate line RG1 connected to the switch transistors SWa and SWb includes a first read gate line RGP1 connected to a gate of the switch transistor SWa in the first cell 2a and a second read gate line RGN1 connected to a gate of the switch transistor SWb in the second cell 2h so that the switch transistors SWa and SWb can be turned on or off, as needed, by respectively applying predetermined, voltages to the switch transistors SWa and SWb.

The read transistors 4a and 4b having their respective one ends connected to the switch transistors SWa and SWb have their respective other ends connected to the common source line SL so that a predetermined voltage can be applied to both the read transistors 4a and 4b via the source line SL.

In addition to such a configuration, each of the program transistors 5a and 5b is an N-type MOS. The program transistor 5a arranged in the one first cell 2a has at its one end diffusion layer connected to the second bit line BLN1, and the program transistor 5b arranged in the other second cell 2b has at its one end a diffusion layer connected to the first bit line BLP1.

Thus, in the present invention, the first bit line BLP1 is connected to the read transistor 4a in the first cell 2a via the switch transistor SWa while being directly connected to the program transistor 5b in the second cell 2b. The second bit line BLN1 is also connected to the read transistor 4b in the second cell 2h via the switch transistor SWb while being directly connected to the program transistor 5a in the first cell 2a, similarly to the first hit line BLP1. The respective other ends of the program transistors 5a and 5h are electrically separated from a diffusion layer of another program transistor adjacent thereto. The control capacitors 6a and 6b have at their respective one ends diffusion layers connected to the control, gate line PG1 and have at their respective other ends diffusion layers short-circuited to a second N-type well N2, described below, so that the potential on the control gate line PG1 can be transmitted to the floating gates FGa and FGb via the insulating film GI4.

In FIG. 1, the area of the insulating film GI4 of the control capacitor 6a is made larger than the area of the gate insulating film GI1 of the erase transistor 3a. Thus, in the present embodiment, the potential from the control gate line PG1 is easily transmitted to the floating gate FGa by an increased area of the insulating film GI4 of the control capacitor 6a. When data is programmed, a large-capacity tunnel current is generated in the insulating film GI3 of the program transistor 5a so that many charges can be injected into the floating gate FGa from a substrate.

Figure 2:
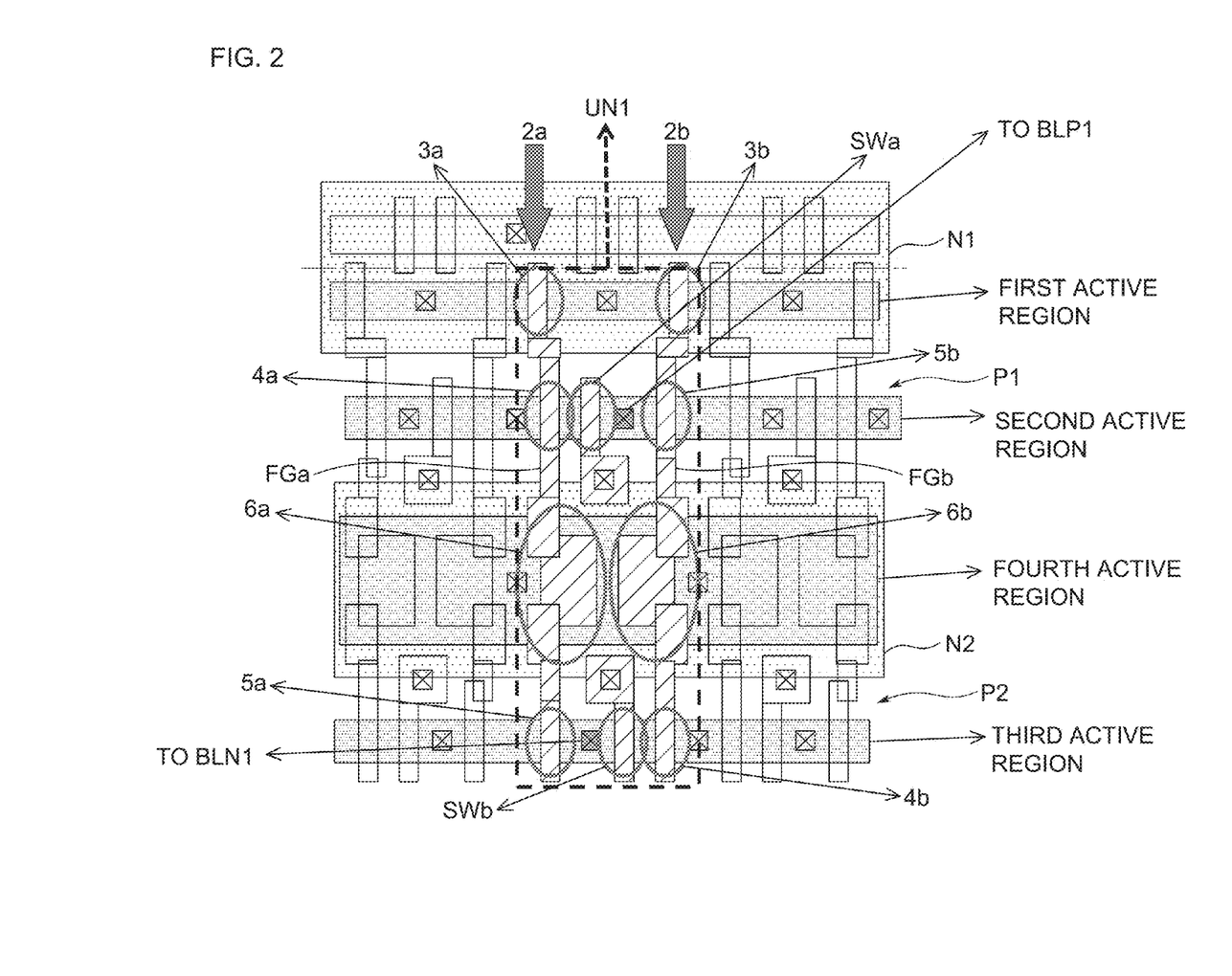
FIG. 2 is a schematic view illustrating a layout of the circuit configuration of the memory unit illustrated in FIG. 1.

FIG. 2 is a schematic view illustrating an example of a layout for implementing a circuit configuration of the memory unit. UN1 illustrated in FIG. 1. In this case, in the memory unit UN1, the first N-type well N1, a first P-type well P1, the second N-type well N2, and a second. P-type well P2 are sequentially arranged on the substrate (not illustrated), and the first cell 2a and the second cell 2h are formed in parallel over the first N-type well N1, the first P-type well P1, the second N-type well N2, and the second P-type well P2. In practice, in the first N-type well N1, a first active region is formed over the first cell 2a and the second cell 2h, and the erase transistors 3a and 3b in the first cell 2a and the second cell 2b are formed in the first active region.

In the first. P-type well P1 adjacent to the first N-type well N1, a second active region is formed over the first cell 2a and the second cell 2b, and the switch transistor SWa and the read transistor 4a in the first cell 2a and the program transistor 5b in the other second cell 2b are formed in the second active region. Further, a fourth active region is formed over the first cell 2a and the second cell 2b in the second N-type well N2 electrically insulated from the first N-type well N1, and the control capacitors 6a and 6b in the first cell 2a and the second cell 2b are formed in the fourth active region.

In the second P-type well P2 adjacent to the second N-type well N2, a third active region is formed over the first cell 2a and the second cell 2h, and the program transistor 5a in the first cell 2a and the switch transistor SWb and the read transistor 4b in the second cell 2b are formed in the third active region. In the memory unit UN1, the floating gates FGa and FGb are arranged to run side by side over the first active region, the second active region, the fourth active region, and the third active region, and the floating gates FGa and FGb are respectively formed over the erase transistors 3a and 3b, the read transistors 4a and 4b, the program transistors 5a and 5b, and the control capacitors 6a and 6b.

The memory unit UN1 is made to have an arrangement configuration as illustrated in FIG. 2 so that the erase transistors 3a and 3b, the read transistors 4a and 4b, the program transistors 5a and 5b, the control capacitors 6a and 6b, and the switch transistors SWa and SWb can be efficiently mounted. As a whole, the memory unit UN1 can be miniaturized. In this case, the program transistor 5b, for example, is adjacent to a program transistor in the other memory unit but the diffusion layer at the other end thereof is electrically insulated from the diffusion layer of the other program transistor, as described above. As such an insulating method between the program transistors, the diffusion layers of the adjacent program transistors may be electrically insulated from each other by a device isolation layer, or the other end of the program transistor may be short-circuited to a P-type well having a different conductivity type from that of the program transistor, for example.

In the present invention, if the circuit configuration of the memory unit UN1 illustrated in FIG. 1 can be implemented, not only a layout illustrated in FIG. 2 but also various other layouts may be used. As the other layouts, the above-mentioned third active region may be formed in the first P-type well P1, and the second active region and the third active region may be formed in the first P-type well P1, for example.

(2) Data Programming Operation

Figure 3:
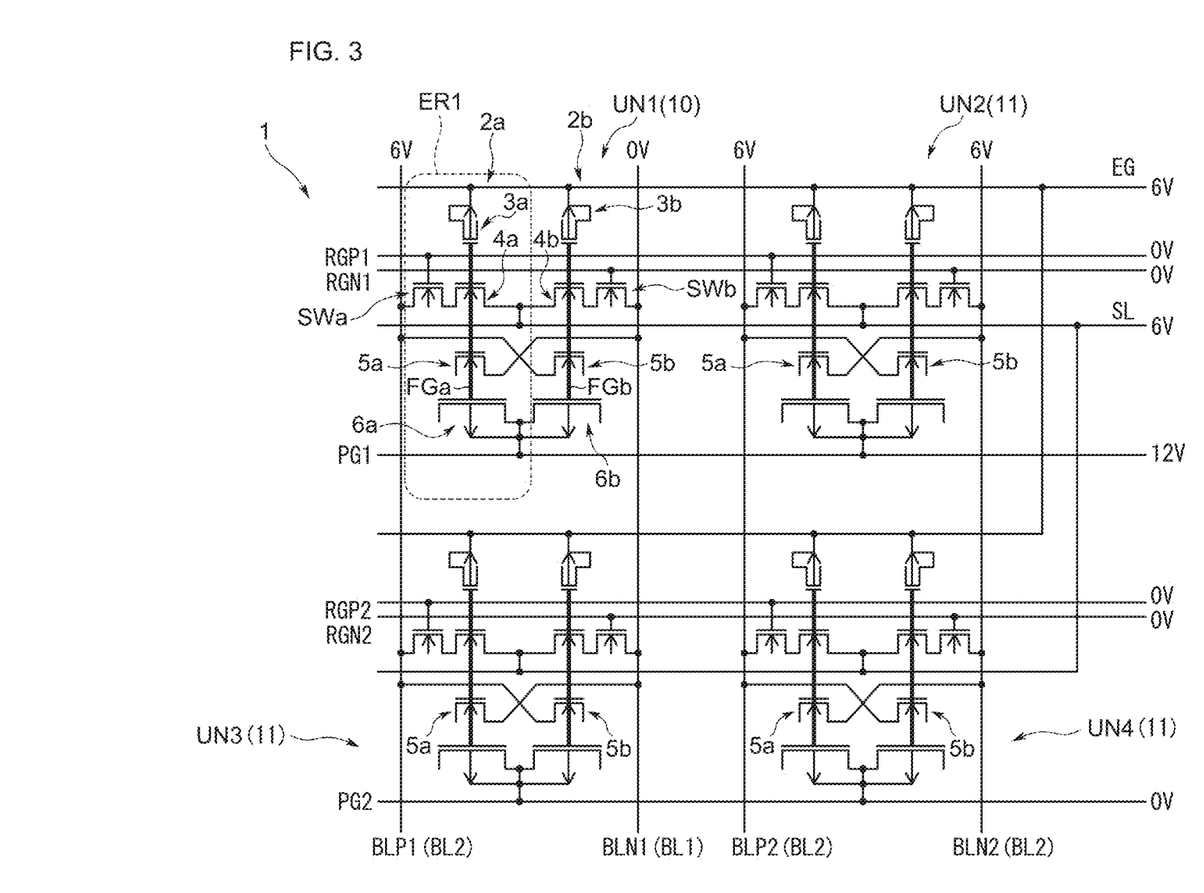
FIG. 3 is a circuit diagram illustrating respective voltage values in sites during data programming.

FIG. 3 illustrates a non-volatile semiconductor memory device 1 in which the memory unit UN1 illustrated in FIG. 1 is arranged in two rows and two columns as memory units UN1, UN2, UN3, and UN4, and illustrates respective voltage values in sites when data is programmed to only a first cell 2a (i.e., an area ER1) in the memory unit UN1 in the first row and the first column among the plurality of memory units UN1, UN2, UN3, and UN4. The memory unit UN1 in which data is programmed to either one of the first cell 2a or the second cell 2b is referred to as a selected memory unit 10, and the memory units UN2, UN3, and UN4 in which data is programmed to neither one of the first cell 2a and the second cell 2b are referred to as non-selected memory units 11.

In this case, in the non-volatile semiconductor memory device 1, in the first column (hereinafter referred to as a selected column) in which the selected memory unit 10 is arranged, a second bit line BLN1 connected to the program transistor 5a in the first cell (hereinafter referred to as a selected cell) 2a to which data is programmed is a selected bit line BL1, and a programming voltage of 0 [V] can be applied to the selected bit line BL1. In this case, a programming gate voltage of 12 [V] can be applied to a control gate line PG1 connected to the selected memory unit 10. Thus, a control capacitor 6a connected to the control gate line PG1 can raise a voltage at a floating gate FGa by a capacitive coupling of an insulating film GI4 (FIG. 1) and the floating gate FGa.

In the non-volatile semiconductor memory device 1, the programming voltage of 0 [V] is applied to the selected bit line BL1 so that a channel potential of the program transistor 5a in the selected cell 2a becomes 0 [V] that is the same as that on the selected bit line BL1, and the programming gate voltage (12 [V]) on the control gate line PG1 causes a large voltage drop between the floating gate FGa and a channel of the program transistor 5a.

Thus, in the selected memory unit. 10, charge can be injected into the floating gate FGa from a substrate in the channel of the program transistor 5a due to a quantum tunnel effect produced by a potential difference between the floating gate. FGa and the program transistor 5a. As a result, the selected memory unit 10 can enter a state where the charge is stored in the floating gate FGa so that data is programmed.

At this time, a programming inhibition voltage of 6 [V] is applied to a first bit line BLP1 serving as a non-selected bit line BL2. Thus, in the selected memory unit 10, the programming inhibition voltage of 6 [V] can be applied from the first bit line BLP1 to one end of a program transistor 5b in the other second cell (hereinafter referred co as a non-selected cell) 2b to which data is not programmed. Thus, in the second cell 2b serving as the non-selected cell in the selected memory unit 10, a channel potential of the program transistor 5b becomes 6 [V] that is the same as the programming inhibition voltage on the first bit line BLP1. Thus, a potential difference from the programming gate voltage (12 [V]) on the control gate line PG1 becomes small. As a result, a quantum tunnel effect is not produced so that no charge can be injected into the floating gate FGa.

At this time, a programming inhibition voltage of 6 [V] is also applied to an erase gate line PG and a source line SL. In the first cell 2a and the second cell 2b in the selected memory unit. 10, respective potential differences between gate insulating films GI1 (FIG. 1) of erase transistors 3a and 3b connected to the erase gate line PG and the floating gates FGa and FGb, and between gate insulating films GI2 (FIG. 1) of read transistors 4a and 4b connected to the source line SL and the floating gates FGa and FGb become small. A quantum tunnel effect is not produced in the region of each of the erase transistors and the read transistors so that no charge can be injected into the floating gates FGa and FGb.

In addition thereto, an off voltage of 0 [V] is applied to a first read gate line RGP1 and a second read gate line RGN1 arranged in the selected memory unit 10 at this time. Thus, in the selected memory unit 10, a switch transistor SWa in the first selected cell 2a is turned off by applying the off voltage of 0 [V] to its gate from the first read gate line RGP1 so that the voltage on the first bit line BLP1 is interrupted. Thus, the voltage on the first bit line BLP1 cannot be applied to the read transistor 4a. Similarly, in the selected memory unit. 10, a switch transistor SWb in the second cell 2b is also turned of by applying she off voltage of 0 [V] to its gate from the second read gate line RGN1 so that the voltage on the second hit line BLN1 is interrupted. Thus, the voltage on the second bit line. BLN1 cannot be applied to the read transistor 4b.

In this case, the erase gate line EG is shared among the plurality of memory units UN1, UN2, UN3, and UN4 so that a predetermined voltage can be collectively applied to the erase transistors 3a and 3h in the memory units UN1, UN2, UN3, and UN4. The source line SL is also shared among the plurality of memory units UN1, UN2, UN3, and UN4 so that a predetermined voltage can be collectively applied to the read transistors 4a and 4b in the memory units UN1, UN2, UN3, and UN4.

In the memory unit UN2 serving as the non-selected memory unit 11, the programming gate voltage of 12 [V] is applied to the control gate line PG1 shared with the selected memory unit 10 while a programming inhibition voltage of 6 [V] is applied to a first bit line BLP2 and a second bit line BLN2 serving as non-selected bit lines BL2. Thus, respective potential differences between floating gates FGa and FGb and program transistors 5a and 5b are small. A quantum tunnel effect is not produced in the region of each of the program transistors so that no charge can be injected into the floating gates FGa and FGb.

In the memory unit UN3 serving as the non-selected memory unit 11, a programming voltage is also applied to the second hit line BIM shared with the selected, memory unit 10 while a pro ramming inhibition gate voltage of 0 [V] is applied to a control gate line PG2. Thus, there are no respective potential differences between floating gates FGa and FGb and program transistors 5a and 5b. A quantum tunnel effect is not produced in the region of each of the program transistors so that no charge can be injected into the floating gates FGa and FGb.

Thus, in the non-volatile semiconductor memory device 1, the read transistor 4a is not used as a charge transfer path but only the program transistor 5a can inject charge into only the floating gate FGa provided in the first cell 2a in the selected memory unit 10, and does not inject charge into the second cell 2b in the selected memory unit 10 and the floating gates FGa and FGb provided in the first cell 2a and the second cell 2b in the other non-selected, memory unit 11. Thus, data can be programmed to only the first cell 2a in the selected memory unit 10.

(3) Data Erasing Operation

Figure 4:
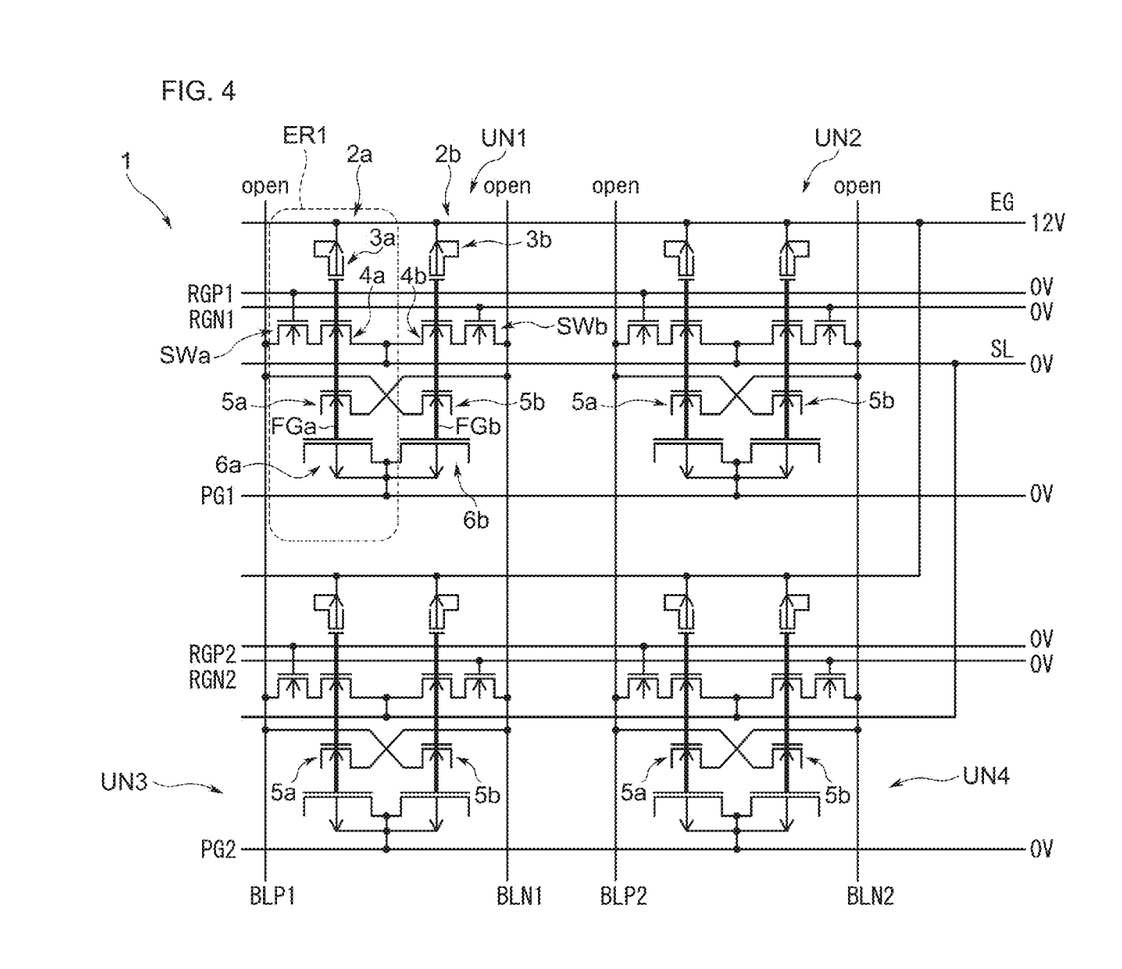
FIG. 4 is a circuit diagram illustrating respective voltage values in the sites during data erasure.

Then, in the non-volatile semiconductor memory device 1, application of a voltage when data in the memory units UN1, UN2, UN3, and UN4 are erased will be described below. FIG. 4, in which portions corresponding to those illustrated in FIG. 3 are assigned the same reference numerals, illustrates respective voltage values in sites when the data in the memory units UN1, UN2, UN3, and UN4 are erased.

In this case, in the non-volatile semiconductor memory device 1, an erase voltage of 12 [V] can be applied to the erase gate line EG, and 0 [V] can be applied to the source line. St and the control gate lines PG1 and PG2. In this case, in the non-volatile semiconductor memory device 1, 0 [V] is applied to the first read gate lines RGP1 and RGP2 and the second read gate lines RGN1 and RGN2 so that the switch transistors SWa and SWb are turned off. Thus, electrical connection between the first hit line BLP1 and the read transistor 4a and between the second bit line BLN1 and the read transistor 4b can be shut off.

In the non-volatile semiconductor memory device 1, the first bit line BLP1 and the second bit line BLN1 are opened so that a strong electric field is applied to only the gate insulating films GI1 of the erase transistors 3a and 3b connected to the erase gate line EG. Thus, the erase transistors 3a and 3b can draw charge in the floating gates FGa and FGb into their channels, and can erase data in the memory units UN1, UN2, UN3, and UN4 by mat collective processing.

Therefor, in the non-volatile semiconductor memory device 1, the charge can be ejected from the floating gates FGa and FGb without using regions of the read transistors 4a and 4b in each of the memory units UN1, UN2, UN3, and UN4 as charge transfer paths but using only regions of the erase transistors 3a and 3b so that mat collective erasure of data can be performed.

(4) Data Reading Operation

Figure 5:
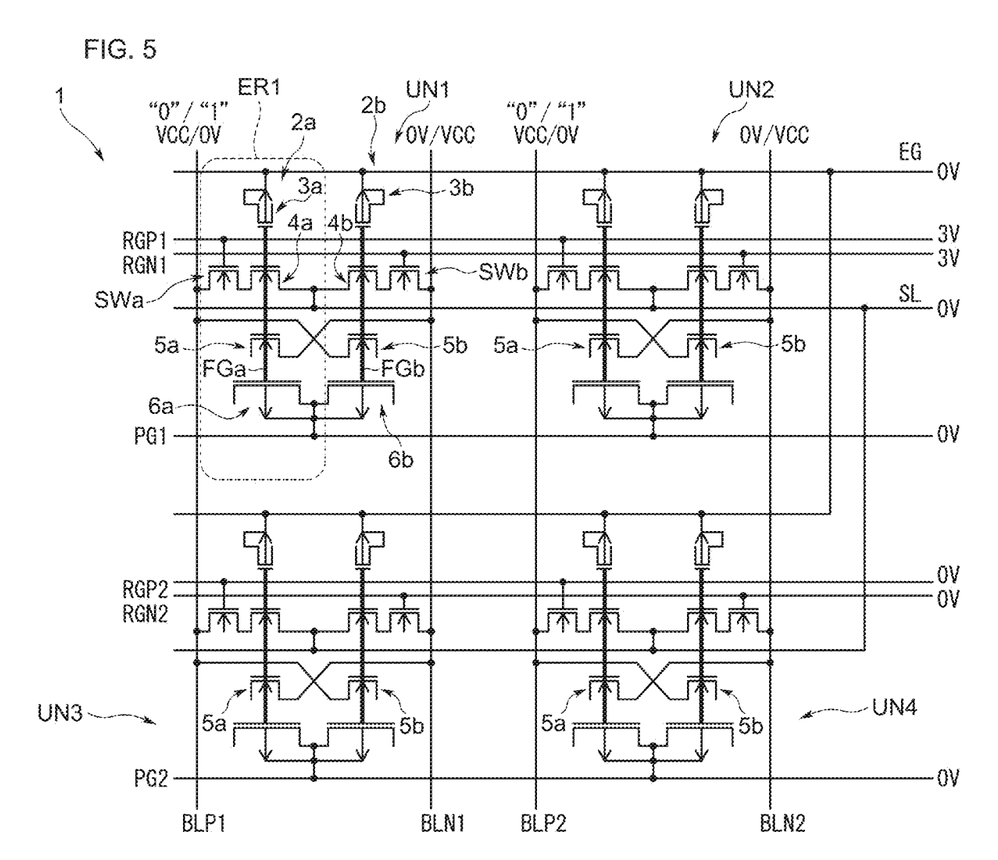
FIG. 5 is a circuit diagram illustrating respective voltage values in the sites during data reading.

Then, in the non-volatile semiconductor memory device 1, application of a voltage when data is read out will be described below. FIG. 5, in which portions corresponding to those illustrated in FIG. 3 are assigned the same reference numerals, illustrates respective voltage values in sites when the data in the memory unit UN1 among the memory units UN1, UN2, UN3, and UN4 is read out. Here, the data is programmed only to the first cell 2a in the memory unit UN1 among the memory units UN1, UM, UN3, and UN4, and is not programmed to the second cell 2b in the memory unit UN1. A state where charge is stored in the floating gate FGa is "0", for example, and a state where no charge is stored in the floating gate FGb is "1".

In this case, in the non-volatile semiconductor memory device 1, an on voltage of 3 [V] is applied to the first read gate line RGP1 and the second read gate line RGN1, to turn on both the switch transistors SWa and SWb. At this time, 0 [V] can be applied to the source line SL, and VCC can be applied as a reading voltage to the first bit lines BLP1 and BLP2 and the second bit lines BLN1 and BLN2.

In the first cell 2a in which charge is stored in the floating gate FGa, the read transistor 4a is turned off when 0 [V] is applied to its source, and electrical connection between the read transistor 4a and the first bit line BLP1 is shut of so that a voltage on the first bit line BLP1 remains VCC. On the other hand, in the other second cell 2.b in which no charge is stored in the floating gate FGb (it is assumed that respective threshold voltages Vth of the read transistors 4a and 4b are in a deplete state), the read transistor 4b is turned on when 0 [V] is applied to its source, and the read transistor 4b and the second bit line BLN1 are electrically connected to each other so that a voltage on the second bit line BLN1 changes to be lower than VCC.

In the non-volatile semiconductor memory device 1, the second bit line BLN1 becomes lower in potential than the first bit line BLP1. A potential difference between the first bit line BLP1 and the second bit line BLN1 is latched by a latch circuit (not illustrated) so that the first bit line BLP1 is fixed to VCC while the second bit line BLN1 is fixed to 0 V. Thus, reading information can be finalized.

In the present embodiment, in the non-volatile semiconductor memory device. 1, 0 [V] is applied to the erase gate line EG and the control gate lines PG1 and PG2 so that transfer of charge in the floating gates FGa and FGb during data reading by the erase transistors 3a and 3b and the control capacitors 6a and 6b can be prevented.

While a case where 0 [V] is applied to the erase gate line EG and the control, gate lines PG1 and PG2 has been described in the present embodiment, the present invention is not limited to this. A predetermined voltage of VCC, for example, may be applied to the erase gate line EG or the control gate lines PG1 and PG2. In this case, a potential at the floating gate FGb rises due to capacitive coupling between the control capacitor 6b and the floating gate FGb, for example, by applying VCC to the control gate lines PG1 and PG2. As a result, an on current output from the read transistor 4b increases, and a period of time elapsed, until data is latched can be shortened.

In the present embodiment, in the memory units UN3 and UN4 from which data is not read out, an off voltage of 0 [V] is applied to the first read gate line RGP2 and the second read gate line RGN2, the switch transistors SWa and SWb are turned off, and data in the floating gate is not read out. Thus, only data in the memory unit UN1 can be read out.

(5) Operation and Effect

In the above-mentioned configuration, the non-volatile semiconductor memory device 1 includes the read transistors 4a and 4b for reading out a voltage depending on the presence or absence of charge in the floating gates FGa and Fob, the program transistors 5a and 5b that inject charge into the floating gates FGa and Fob, the erase transistors 3a and 3b that eject charge from the floating gates FGa and Fob, and the control capacitors 6a and 6b that adjust potentials at the floating gates FGa and FGb. The floating gate FGa (FGb) extends on the respective active regions of the lead transistor 461 (4b), the program transistor 5a (5b), the erase transistor 3a (3b), and the control capacitor 6a (6b).

In the first cell 2a, the first bit line BLP1 is connected to the read transistor 4a via the switch transistor SWa, the second hit line BLN1 is directly connected to the program transistor 5a. On the other hand, in the second cell 2b paired with the first cell 2a, the second bit line BLN1 is connected to the read transistor 4b via the switch transistor SWb, and the first bit line BLP1 is directly connected to the program transistor 5b.

Thus, in the non-volatile semiconductor memory device 1, the read transistors 4a and 4b for reading out data in the floating gates FGa and FGb do not serve as charge transfer paths during data programming and erasure. Therefore, damage from an applied electric field to and hot-carrier stress on the gate oxide films of the read transistors 4a and 4b can be prevented. Thus, malfunctions of the read transistors can be prevented because a reading current is prevented from deteriorating by programming and erasure of data.

In the non-volatile semiconductor memory device 1, the read transistors 4a and 4b do not serve as charge transfer paths during data programming and erasure. Thus, malfunctions of the read transistors can be prevented because a part of charge is not injected into sidewall regions of the read transistors 4a and 4b and Vths of the read transistors 4a and 4b are not shifted even if data programming and erasure are repeated.

Furthermore, in the non-volatile semiconductor memory device 1, although the first bit line BLP1 and the second bit line BLN1 are provided, i.e., the number of bit lines is two, the second bit line BLN1 used for programming in the one first cell 2a also serves as a reading bit line in the other second cell 2b. Thus, the number of hit lines and the number of cells are the same as a whole. The effective number of bit lines is one per cell. Therefore, the device can be miniaturized as a whole.

According to the above-mentioned configuration, in the non-volatile semiconductor memory device 1, the second bit line BLN1 connected to the program transistor 5a in the first cell 2a for performing data programming also serving as a reading bit line in the other second cell 2b by switching of the switch transistors SWa and SWb and the program transistors 5a and 5b and the erase transistors 3a and 3h serving as charge transfer paths during data programming and erasure are provided so that malfunctions of the read transistors 1a and 4b that occur because the read transistors are used for data writing and erasure can be reliably prevented without increasing the number of bit lines.

(6) As to Monitoring of Vths of First and Second Cells of Complementary Type In a test of the memory unit UN1, in the case of not the complementary cell, like in the above-mentioned embodiment, but one cell per bit, for example, Vths (threshold voltages) of the read transistors 4a and 4b can be monitored by merely controlling a voltage applied to the control gate line PG1.

If the first cell 2a and the second cell 2b constitute a complementary cell storing one bit data by using two cells, like in the above-mentioned embodiment, however, when both the switch transistors SWa and SWb each connected to die read gate line RG1 are turned on, a potential on the bit line on the complementary side changes due to a state of the cell on the complementary side. Thus, the first bit line BLP1 that has decreased in voltage more early is "1", and the other second bit line ELM is correspondingly forced to be "0", for example, by the latch circuit (not illustrated) so that normal monitoring cannot be performed.

Figure 6:
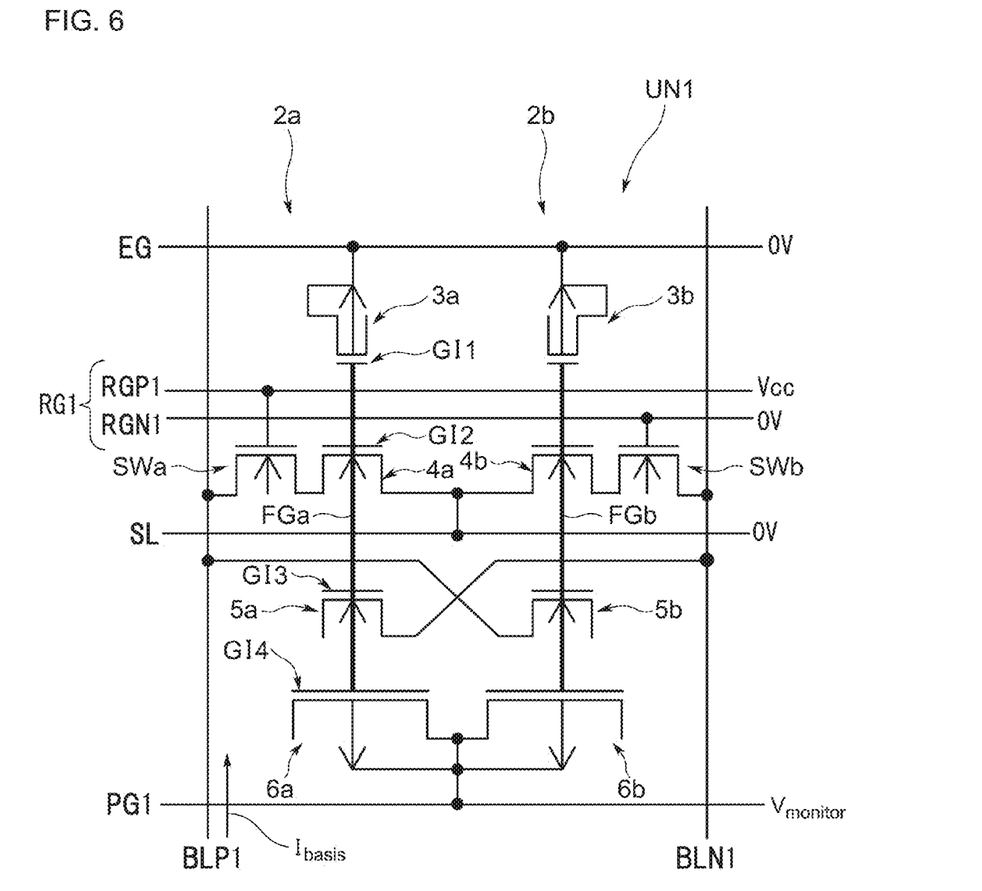
FIG. 6 is a circuit diagram provided to describe monitoring of Vths in first and second cells of a complementary type.

Therefore, in the present invention, in a memory unit UN1 constituting a complementary cell, a read gate line RG1 within the memory unit UN1 includes a first read gate line RGP1 and a second read gate line RGN1, and the first read gate line RGP1 and the second read gate line RGN1 are independently controlled, to individually turn on or off the switch transistors SWa and SWb so that Vths of a first cell 2a and a second cell 2b can be individually monitored, as illustrated in FIG. 6.

FIG. 6 illustrates respective voltage values in sites when Vth of the first cell is monitored in the memory unit UN1 illustrated in FIG. 1. In this case, in the memory unit. UN1, 0 [V] can be applied to an erase gate line EG and a source line SL, a predetermined voltage of VCC can be applied, to the first read gate line RGP1 connected to the first cell 2a that monitors Vth, and 0 [V] can be applied to the second read gate line RGN1 connected to the second cell 2b that does not monitor Vth. Thus, in the memory unit UN1, 0 [V] is applied to the second read gate line RGN1, to force the switch transistor SWb no be turned off and shut off electrical connection between a floating gate FGb and a second bit line BLN1 by the switch transistor SWb so that a voltage on the second bit line BLN1 can be kept constant independently of a potential state of the second cell. 2b.

In this state, in the memory unit. UN1, a predetermined voltage, e.g., VCC/2 is applied to the second bit line BLN1, a reference current. $I_{basis}$ for determining Vth is caused to flow through the first hit line BLP1, and a monitor voltage $V_{monitor}$ is applied to a control gate line PG1 while a voltage value of the monitor voltage $V_{monitor}$ applied to the control gate line PG1 is changed. Thus, in the memory unit UN1, a voltage at the floating gate FGa rises due to a capacitive coupling occurring between a control capacitor 6a and a floating gate FGa depending on the voltage value of the monitor voltage $V_{monitor}$ applied to the control gate line PG1 so that an on current flowing through a read transistor 4a can be changed.

In this case, in the memory unit UN1, if the on current flowing from the read transistor 4a in the first cell 2a is not less than the reference current. $I_{basis}$, the first bit line BLP1 becomes lower in potential than the second bit line BLN1 and is latched to 0 [V]. Thus, it can be determined that Vth of the first cell 2a is not more than the monitor voltage $V_{monitor}$. On the other hand, if only an on current, which is not more than the reference current $I_{basis}$, flows from the read transistor 4a in the first cell 2a, the first bit line BLP1 becomes higher in potential than the second bit line BLN1 and is latched to VCC after a predetermined period of time. Thus, it can be determined that Vth of the first cell 2a is not less than the monitor voltage $V_{monitor}$.

While a case where Vth of the read transistor 4a in the first cell 2a is monitored has been described in the above-mentioned embodiment, Vth of a read transistor 4b in the second cell 2b can also be monitored in a similar principle to that in the above-mentioned embodiment. More specifically, a predetermined voltage of VCC is applied to the second read gate line RGN1 connected to the second cell 2b that monitors Vth, and 0 [V] is applied to the first read gate line RGP1 connected to the first cell 2a that does not monitor Vth, to turn off the switch transistor SWa and shut off electrical connection between the floating gate FGa and the first his line BLP1 by the switch transistor SWa so that the first bit line BLP1 can be maintained at a predetermined voltage.

In this state, in the memory unit. UN1, the reference current $I_{basis}$ for determining Vth is caused to flow through the second bit line BLN1, and the monitor voltage $V_{monitor}$ is applied to the control gate line PG1 while a voltage value of the monitor voltage $V_{monitor}$ to be applied to the control gate line PG1 is changed, to determine whether an on current flowing from the read transistor 4b is not less than the reference current $I_{basis}$.

(7) Another Embodiment

Figure 7:
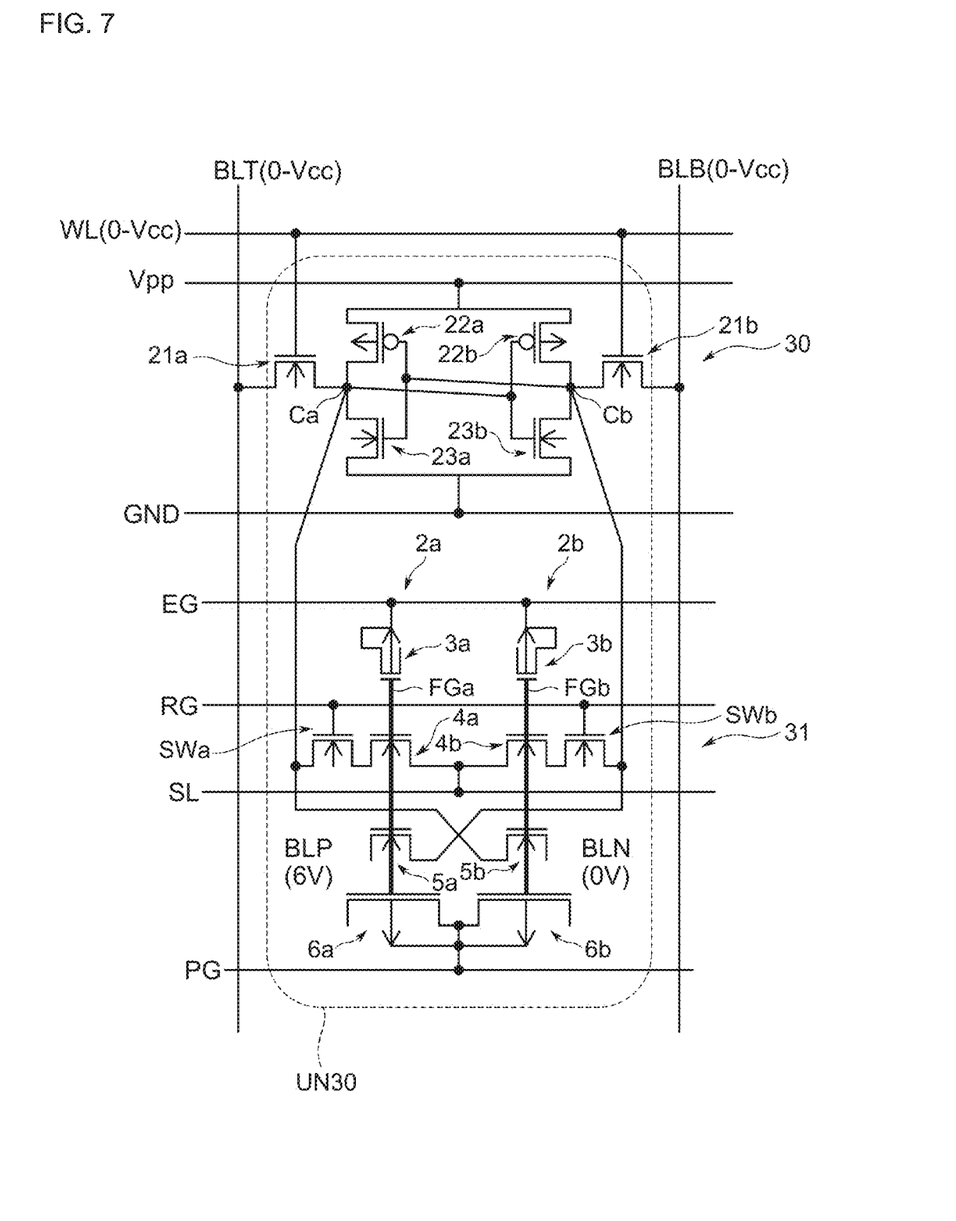
FIG. 7 is a circuit diagram illustrating a circuit configuration of a memory unit including an SRAM cell.

A memory unit combined with an SRAM (Static Random Access Memory) cell will be described below. FIG. 7, in which portions corresponding to the portions illustrated in FIG. 1 are assigned the same reference numerals, illustrates one memory unit UN30 constituting a non-volatile semiconductor memory device according to the present invention. While the non-volatile semiconductor memory device according to the embodiment has a configuration in which a plurality of memory units are arranged in a matrix, the one memory unit UN30 is paid attention to, to describe the configuration below. As illustrated in FIG. 7, the memory unit UN30 has a characteristic in that an SRAM cell 30 is connected to a non-volatile memory unit 31 including a first cell 2a and a second cell 2b.

The SRAM cell 30 includes access transistors 21a and 21b composed of an N-type. MOS transistor, load transistors 22a and 22b composed of a P-type MOS transistor, and drive transistors 23a and 23b composed of an N-type MOS transistor, i.e. a total of six MOS transistors. The load transistors 22a and 22b have their respective drains connected to drains of the drive transistors 23a and 23b, have their respective sources connected to a power supply line Vpp, and further have their respective gates connected to gates of the drive transistors 23a and 23b. The drive transistors 23a and 23b have their respective sources connected to a ground line GND.

The access transistor 21a has its drain connected to a complementary first bit line BIT and has its source connected to a storage node Ca between the load transistor 22a and the drive transistor 23a and the gates of the load transistor 22b and the drive transistor 23b. On the other hand, the other access transistor 21b similarly has its drain connected to a complementary second bit line BIB and has its source connected to a storage node Cb between the load transistor 22b and the drive transistor 23b and the gates of the load transistor 22a and the drive transistor 23a. Further, the access transistors 21a and 21b have their respective gates connected to a common word line WI. A latch-type sense amplifier (not illustrated) is connected between the complementary first bit line BIT and the complementary second bit line BLB.

In addition to such a configuration, in the SRAM cell 30, a first bit line BLP in the first cell 2a is connected to the one storage node Ca while a second bit line BLN in the second cell 2b is connected to the other storage node Cb. While the non-volatile memory unit 31 has substantially the same configuration as that of the memory unit UN1 illustrated in FIG. 1 described in the above-mentioned embodiment, the number of read gate lines RG is set to one so that switch transistors SWa and SWb can be collectively controlled to be turned on or off.

Figure 8:
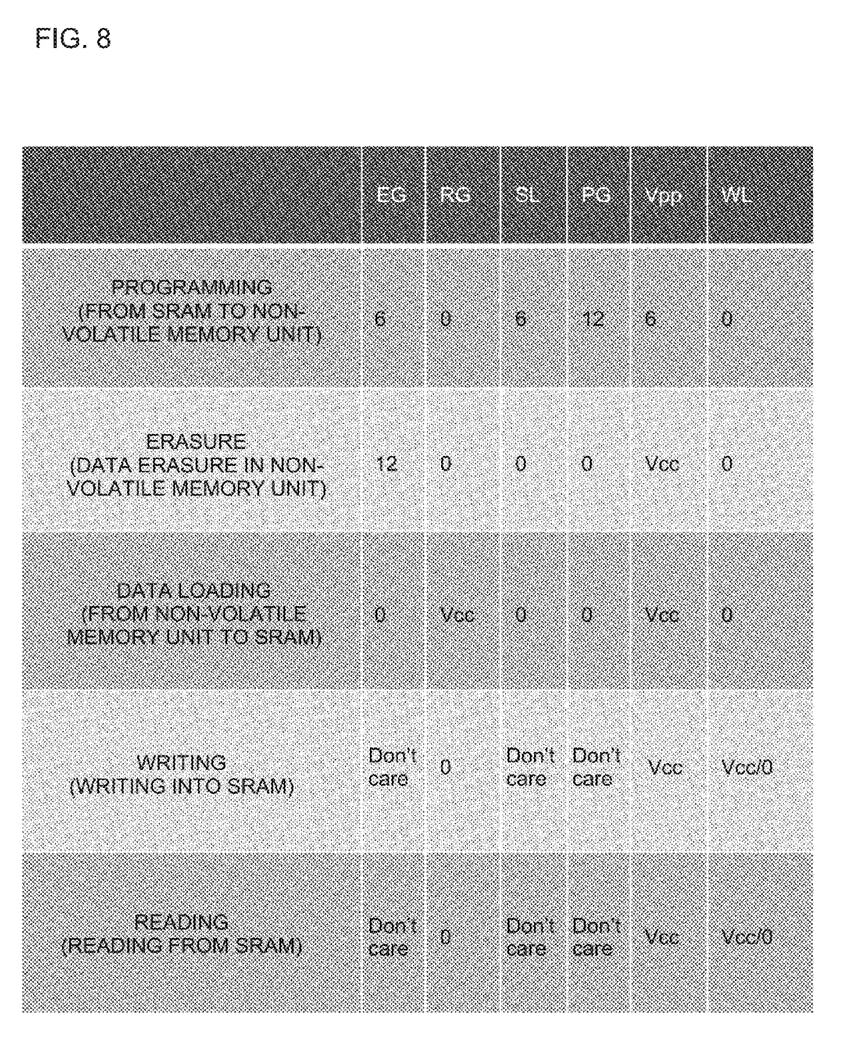
FIG. 8 is a table illustrating respective voltage values in sites during data programming, data erasure, data loading, data writing, and data reading in the memory unit illustrated in FIG. 7.

The memory unit UN 30 having such a configuration writes and reads data into and out of the outside using the SRAM cell 30. FIG. 8 illustrates respective voltage values in sites during data writing into the SRAM cell 30 in the memory unit UN30 (written as "writing" in FIG. 8), during data reading from the SRAM cell 30 (written as "reading" in FIG. 8), during programming for incorporating data into the non-volatile memory unit 31 from the SRAM cell 30 (written as "programming" in FIG. 8), during data erasure in the non-volatile memory unit 31 (written as "erasure" in FIG. 8), and during data loading for incorporating data again into the SRAM cell 30 from the non-volatile memory unit 31 (written as "data loading" in FIG. 8). In FIG. 8, "Don't care" is written in the site that can be set to any voltage value.

(7-1) Writing of Data into SRAM Cell

In this case, in writing of data into the SRAM cell 30, a predetermined voltage of Vcc is applied to the word line WL, to turn on both the access transistors 21a and 21b connected to the word line WE. In this case, the predetermined voltage of Vcc can also be applied to the power supply line Vpp. In the SRAM cell 30, when Vcc is applied as a writing voltage to the one complementary first bit line BLT, for example, 0 [V] can be applied as a writing inhibition voltage to the other complementary second bit line BLB.

Thus, the complementary second bit line BLB and the gates of the one load transistor 22a and the one drive transistor 23a are electrically connected to each other via the other access transistor 21b so that the gates become Low. As a result, the load transistor 22a is turned on while the drive transistor 23a is turned off. Thus, the storage node Ca between the load transistor 22a and the drive transistor 23a is electrically connected to the power supply line Vpp via the load transistor 22a so that a voltage at the storage node Ca becomes High.

At this time, the complementary first bit line BLT and the gates of the other load transistor 22b and the other drive transistor 23b are electrically connected via the one access transistor 21a so that the gates become High. As a result, the load transistor 22b is turned, off while the drive transistor 23b is turned on. Thus, the storage node Cb between the load transistor 22b and the drive transistor 23b is electrically connected to the ground line GND via the drive transistor 23b so that a voltage at the storage node Cb becomes Low. From the foregoing, the SRAM cell 30 enters a state where data is written.

(7-2) Reading of Data from SRAM Cell

When data in the SRAM cell 30 is read out, a predetermined voltage of Vcc is applied to the word line WL, no turn on both the access transistors 21a and 21b connected to the word line WL. Thus, in the memory unit UN30, a potential at the one storage node Ca is read out via the complementary first bit line BLT while a potential at the other storage node Cb is read out via the complementary second bit line BLB so that a sense amplifier can determine data "0" and "1" recorded on the storage node.

(7-3) Programming into Non-volatile Memory Unit

In the present invention, data recorded on the above-mentioned SRAM cell can be incorporated into the non-volatile memory unit 31 by mat collective processing based on a principle of "(2) Data Programming Operation", described above. In the description, the SRAM cell 30 is in a state where the potential at the one storage node Ca is High and the potential at the other storage node Cb is Low.

In this case, in the non-volatile memory unit 31, 6 [V] can be applied to an erase gate line EG, and 12 [V] can be applied to the control gate line PG. In the non-volatile memory unit 31, a program transistor 5b in the second cell 2b is electrically connected to the one storage node Ca, into which data is written, via the first bit line BLP so that a channel potential of the program transistor 5b becomes a high potential that is the same as that at the storage node Ca. Thus, a potential difference between the channel potential and a programming gate voltage (12 [V]) on the control gate line PG becomes small. As a result, a quantum tunnel effect is not produced so that no charge can be injected into a floating gate FGb.

On the other hand, in the non-volatile memory unit 31, a program transistor 5a in the first cell 2a is electrically connected to the other storage node Cb, into which no data is written, via the second bit line BLN so that a channel potential of the program transistor 5a becomes a low potential that is the same as that at the storage node Cb. Thus, a potential difference between the channel potential and the programming gate voltage (12 [V]) on the control gate line PG becomes large. As a result, a quantum tunnel, effect is produced so that charge can be injected into a floating gate FGa. In the memory unit UN30, data recorded on the SRAM cell 30 can be incorporated into the non-volatile memory unit 31 by mat collective processing. Thus, control of a peripheral circuit can also be simplified.

In this non-volatile memory unit 31, an erase transistor 3a and a read transistor 4a do not serve as charge transfer paths but only the program transistor 5a can inject charge into the floating gate FGa, like in the above-mentioned embodiment, during programming for incorporating data into the non-volatile memory unit 31 from the SPAN cell 30. Thus, malfunctions of the read transistors 4a and 4b that occur because the read transistors 4a and 4b serve as charge transfer paths can be reliably prevented.

(7-4) Data Loading from Non-Volatile Memory Unit

In the present invention, data, which has been incorporated once into the non-volatile memory unit 31, as described above, can be written again into the SRAM cell 30 by mat collective processing based on a principle of "(4) Data Reading Operation", described above. The non-volatile memory unit 31 is brought into a state where charge is stored in the floating gate FGa in the one first cell 2a so that data is programmed, and is brought into a state where no charge is stored in the floating gate FGb in the other second cell 1b so that no data is programmed. In this case, in the non-volatile memory unit 31, 0 [V] can be applied, to the erase gate line EG, and 0 [V] can also be applied to the control gate line PG.

In the non-volatile memory unit 31, the predetermined voltage of VCC is applied to a read gate line RG so that respective switch transistors SWa and SWb in the first cell 2a and the second cell 2b are turned on while 0 [V] is applied to sources of the read transistors 4a and 4b so that the read transistors 4a and 4b are turned on. Thus, the non-volatile memory unit 31 can be restored to a state where the read transistor 4a and the first bit line BLP are electrically connected to each other and data is written into the SPAM 30 by increasing a potential at the one storage node Ca in the SRAM cell 30 as a potential at the floating gate FGa increases.

The non-volatile memory unit 31 can be restored to a state where the read transistor 4b and the second bit line BLN are electrically connected to each other and no data is written into the SRAM 30 by decreasing a potential at the other storage node Cb in the SRAM cell 30 as a potential at the floating gate FGb decreases. Further, in the non-volatile memory unit 31, loading of data into the SRAM cell 30 can be performed by mat collective processing. Thus, control of a peripheral circuit can also be simplified.

(7-5) Data Erasure in Non-Volatile Memory Unit

Furthermore, in the present invention, data can also be erased in the non-volatile memory unit 31 based on a principle of "(3) Data Erasing Operation", described above. In this case, in the non-volatile memory unit 31, an erase voltage of 12 [V] can be applied to the erase gate line EG, and 0 [V] can be applied to a source line SL and the control gate line PG. In the non-volatile memory unit 31, a strong electric field is applied to only gate insulating films of the erase transistors 3a and 3h connected to the erase gate line EG so that charge in the floating gates FGa and FGb is ejected by channel layers of the erase transistors 3a and 3b and data in the non-volatile memory unit 31 can be erased by mat collective processing.

The present invention is not limited to the present embodiments. Various modifications can be implemented without departing from the scope of the present invention. In FIGS. 3 to 5 and FIG. 8, for example, voltage values during data programming, data erasure, and data reading are respectively clearly written. However, the present invention is not limited to this. Various voltage values may be applied.

Furthermore, in the above-mentioned embodiment, a case where the erase transistor 3a is formed in an N-type well, the control capacitor 6a is formed in an N-type well different from the above-mentioned N-type well, and the read transistor 4a, the switch transistor SWa, and the program transistor 5a are formed in a P-type well has been described. However, the present invention is not limited to this. The erase transistor 3a may be formed in a P-type well, the control capacitor as may be formed in a P-type well different from the above-mentioned P-type well, and the read transistor 4a, the switch transistor SWa, and the program transistor 5a may be formed in an N-type well.

REFERENCE SIGNS LIST

1 NON-VOLATILE SEMICONDUCTOR MEMORY DEVICE
2a FIRST CELL (CELL)
1b SECOND CELL (CELL)
3a, 3b ERASE TRANSISTOR
4a, 4b READ TRANSISTOR.
5a, 5b PROGRAM TRANSISTOR
6a, 6b CONTROL CAPACITOR
SWa, SWb SWITCH TRANSISTOR.
BLP1, BLP2, BLP FIRST BIT LINE
BLN1, BLN2, BLN SECOND BIT LINE
FGa, FGb FLOATING GATE

What is claimed is:

1. A non-volatile semiconductor memory device including:
 a plurality of floating gates electrically insulated;
 a first bit line;
 a second bit line; and
 a cell being configured for each of the floating gates, wherein
 each of the cells includes a read transistor for reading out a voltage depending on the presence or absence of charge in the floating gate, a program transistor that injects charge into the floating gate, an erase transistor that ejects charge from the floating gate, and a control capacitor that adjusts a potential at the floating gate, the floating gate extending on respective active regions of the read transistor, the program transistor, the erase transistor, and the control capacitor, wherein in each of the cells, the erase transistor is formed in an N-type well or a P-type well, and the control capacitor is formed in another N-type well or another P-type well having the same conductivity type as that of the erase transistor and the read transistor, the switch transistor, and the program transistor are formed in a P-type well or an N-type well having a different conductivity type from that of the erase transistor and the control capacitor,
 one cell of the cells has a configuration in which the first bit line is connected to the read transistor in the one cell via a switch transistor in the one cell, and the second bit line is directly connected to the program transistor in the one cell, and
 the other cell paired with the one cell has a configuration in which the second bit line is connected to the read transistor in the other cell via a switch transistor in the other cell, and the first bit line is directly connected to the program transistor in the other cell, wherein the second bit line is used for data programming in the one cell and for reading in the other cell, and the first bit line is used for data programming in the other cell and for reading in the one cell.

2. The non-volatile semiconductor memory device according to claim 1, further comprising
an erase gate line that uniformly applies a common voltage to the erase transistors respectively provided for the floating gates, and
a source line that uniformly applies another common voltage that is different from the common voltage applied to the erase transistors to the read transistors respectively provided for the floating gates.

3. The non-volatile semiconductor memory device according to claim 1, wherein
the one cell and the other cell constitute one bit, and
gate lines are separately connected to the switch transistors provided for the cells, respectively, and independently controlled to be turned on or off.

4. The non-volatile semiconductor memory device according to claim 1, wherein
the first bit line is directly connected to one storage node in an SRAM cell, and the second bit line is directly connected to the other storage node complementary with the one storage node in the SRAM cell, and
the SRAM cell and the one cell and the other cell constitute one bit.

5. The non-volatile semiconductor memory device according to claim 1, wherein
the program transistor in the other cell is formed in the P-type well or the N-type well in which the switch transistor and the read transistor in the one cell are formed, and
the program transistor in the one cell is formed in another P-type well or another N-type well in which the switch transistor and the read transistor in the other cell are formed.

* * * * *

UNITED STATES PATENT AND TRADEMARK OFFICE
CERTIFICATE OF CORRECTION

PATENT NO. : 9,502,109 B2  
APPLICATION NO. : 14/432797  
DATED : November 22, 2016  
INVENTOR(S) : Yasuhiro Taniguchi et al.

Page 1 of 2

It is certified that error appears in the above-identified patent and that said Letters Patent is hereby corrected as shown below:

In the Specification

Column 4, Line 42; please delete "PG1" and add -- RG1 --

Column 5, Line 41; please delete "2h" and add -- 2b --

Column 5, Line 65; please delete "5h" and add -- 5b --

Column 6, Line 23; please delete "2h" and add -- 2b --

Column 6, Line 28; please delete "2h" and add -- 2b --

Column 6, Line 43; please delete "2h" and add -- 2b --

Column 8, Line 6; please delete "PG" and add -- EG --

Column 8, Line 10; please delete "PG" and add -- EG --

Column 8, Line 35; please delete "3h" and add -- 3b --

Column 8, Line 54; please delete "BIM" and add -- BLN1 --

Column 9, Line 54; please delete "UM" and add -- UN2 --

Column 10, Line 50; please delete "Fob" and add -- FGb --

Column 10, Line 51; please delete "Fob" and add -- FGb --

Column 10, Line 52; please delete "Fob" and add -- FGb --

Signed and Sealed this  
Eighteenth Day of April, 2017

Michelle K. Lee  
*Director of the United States Patent and Trademark Office*

CERTIFICATE OF CORRECTION (continued)
U.S. Pat. No. 9,502,109 B2

Column 10, Line 56; please delete "461" and add -- 4(a) --

Column 11, Line 32; please delete "3h" and add -- 3b --

Column 11, Line 35; please delete "1a" and add -- 4a --

Column 13, Line 26; please delete "BIT" and add -- BLT --

Column 13, Line 31; please delete "BIB" and add -- BLB --

Column 13, Line 36; please delete "WI" and add -- WL --

Column 13, Line 38; please delete "BIT" and add -- BLT --

Column 14, Line 1; please delete "WE" and add -- WL --

Column 15, Line 25; please delete "1b" and add -- 2b --

Column 15, Line 60; please delete "3h" and add -- 3b --

Column 16, Line 13; please delete "as" and add -- 6a --

Column 16, Line 23; please delete "1b" and add -- 2b --